(12) United States Patent
Parekh et al.

(10) Patent No.: US 7,544,554 B2
(45) Date of Patent: Jun. 9, 2009

(54) METHODS OF FORMING GATELINES AND TRANSISTOR DEVICES

(75) Inventors: Kunal R. Parekh, Boise, ID (US); H. Montgomery Manning, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 355 days.

(21) Appl. No.: 11/418,556

(22) Filed: May 5, 2006

(65) Prior Publication Data

US 2006/0211208 A1 Sep. 21, 2006

Related U.S. Application Data

(62) Division of application No. 10/928,514, filed on Aug. 27, 2004, now Pat. No. 7,112,479.

(51) Int. Cl.
*H01L 21/336* (2006.01)

(52) U.S. Cl. .................. 438/197; 438/303; 438/585; 257/E21.409

(58) Field of Classification Search .......... 438/197, 438/299, 301, 303, 305, 306, 585; 257/E21.409
See application file for complete search history.

(56) References Cited

U.S. PATENT DOCUMENTS

| | | | |
|---|---|---|---|
| 5,434,093 A | 7/1995 | Chau et al. | |
| 5,786,256 A | 7/1998 | Gardner et al. | |
| 6,150,669 A | 11/2000 | Nandakumar et al. | |
| 6,326,273 B1 | 12/2001 | Yu | |
| 6,344,397 B1 * | 2/2002 | Horstmann et al. | 438/300 |
| 6,403,487 B1 | 6/2002 | Huang et al. | |
| 6,638,829 B1 | 10/2003 | Cheek et al. | |
| 6,670,250 B2 | 12/2003 | Lee | |
| 6,770,532 B2 | 8/2004 | Chuang et al. | |
| 6,806,534 B2 | 10/2004 | Dokumaci et al. | |
| 6,964,875 B1 | 11/2005 | En et al. | |
| 7,183,184 B2 * | 2/2007 | Doczy et al. | 438/585 |
| 2002/0028568 A1 | 3/2002 | Ueno et al. | |
| 2002/0081792 A1 * | 6/2002 | Howard et al. | 438/200 |
| 2002/0130373 A1 | 9/2002 | Ueno et al. | |
| 2002/0182794 A1 | 12/2002 | Ning et al. | |
| 2004/0219757 A1 | 11/2004 | Olewine et al. | |
| 2005/0287748 A1 * | 12/2005 | Kavalieros et al. | 438/299 |
| 2006/0183277 A1 * | 8/2006 | Brask et al. | 438/197 |

* cited by examiner

Primary Examiner—Tuan N. Quach
(74) Attorney, Agent, or Firm—Wells St. John P.S.

(57) ABSTRACT

The invention includes semiconductor constructions, methods of forming gatelines, and methods of forming transistor structures. The invention can include, for example, a damascene method of forming a gateline. A thin segment of dielectric material is formed between two thicker segments of dielectric material, with the thin and thicker segments of dielectric material being within an opening. A gateline material is formed within the opening and over the thin and thicker segments of dielectric material. The construction comprising the gateline material over the thin and thicker segments of dielectric material can be supported by a semiconductor substrate having a primary surface which defines a horizontal direction. The thin and thicker segments of dielectric material can comprise upper surfaces substantially parallel to the primary surface of the substrate, and can join to one another at steps having primary surfaces substantially orthogonal to the primary surface of the substrate.

9 Claims, 4 Drawing Sheets

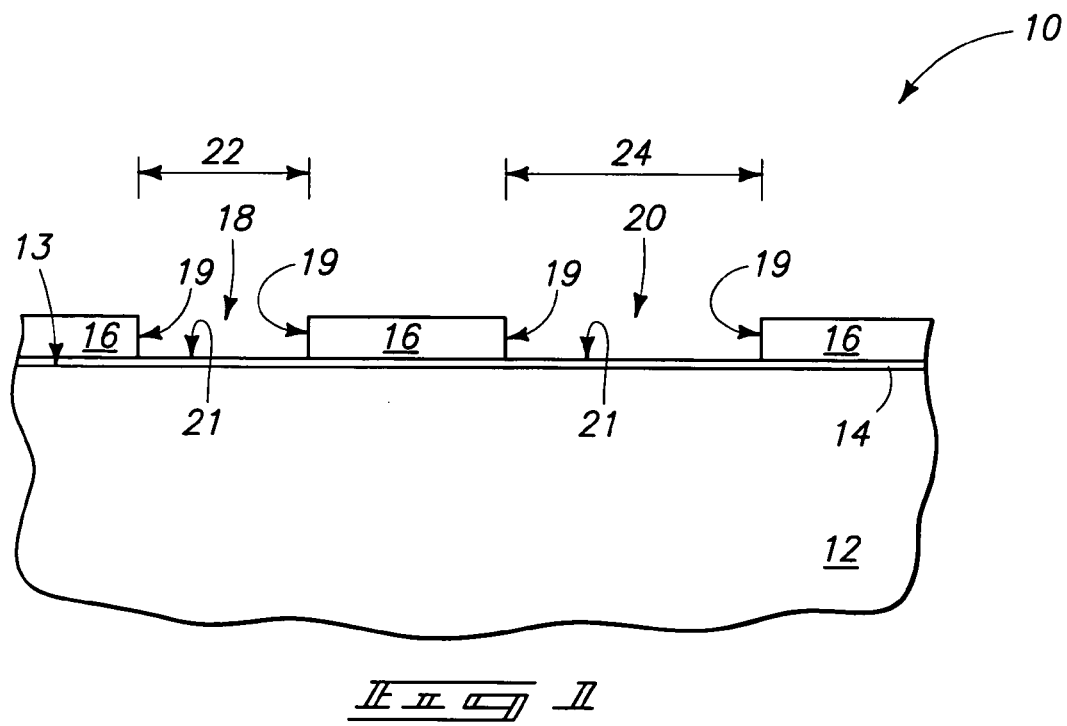
_Fig. 1_
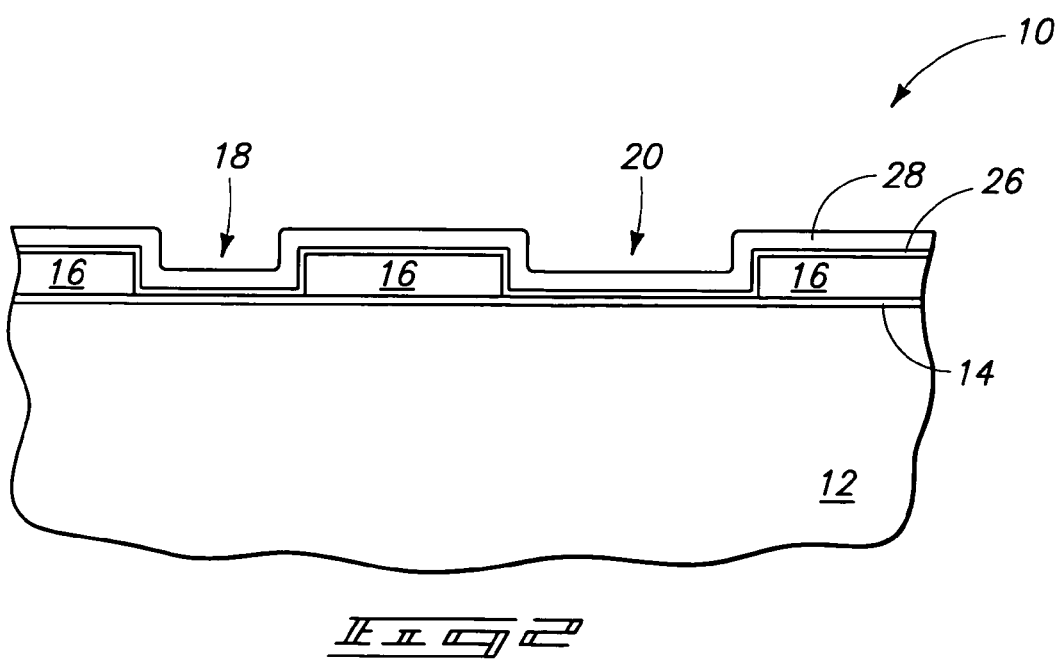
_Fig. 2_

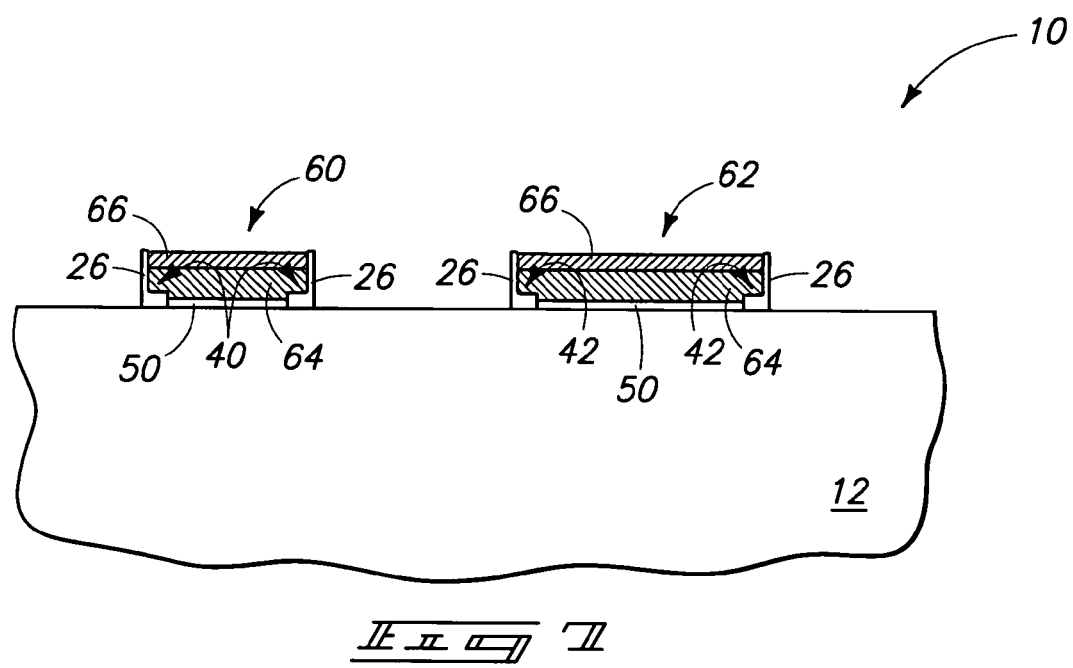
_FIG. 7_
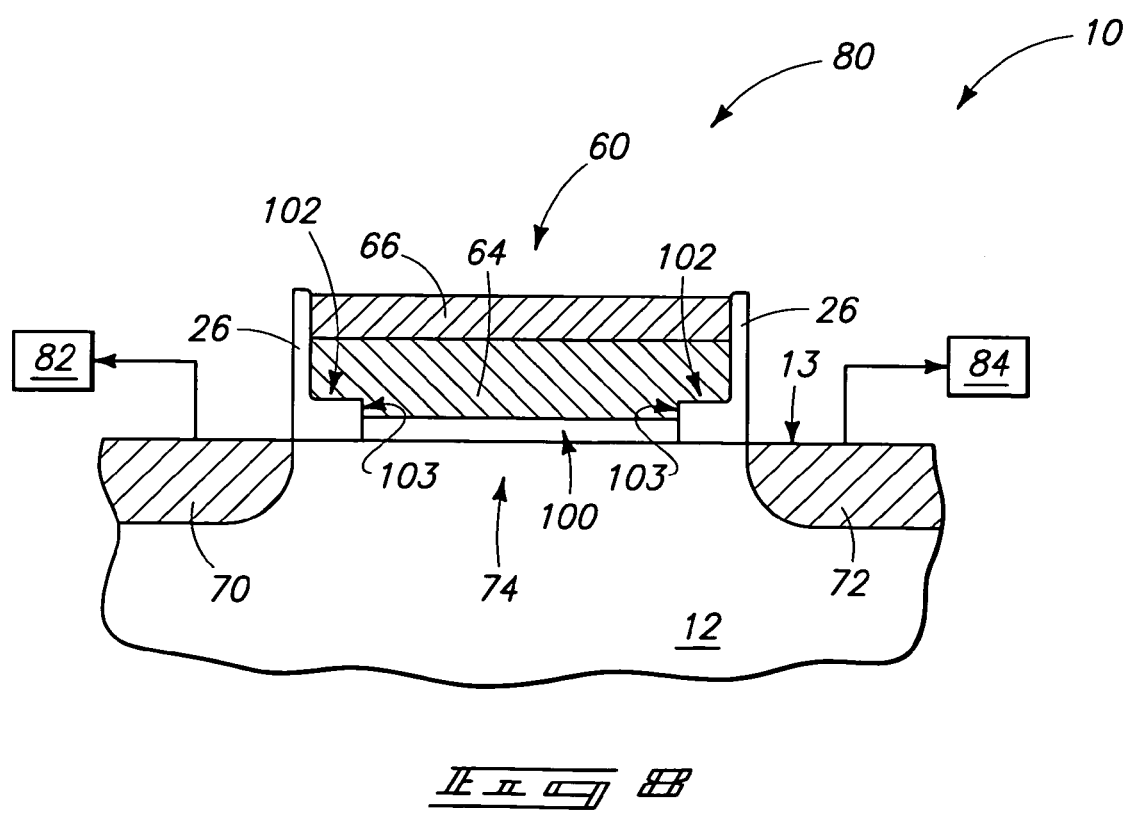
_FIG. 8_

METHODS OF FORMING GATELINES AND TRANSISTOR DEVICES

This patent resulted from a divisional of U.S. patent application Ser. No. 10/928,514, filed Aug. 27, 2004, which issued as U.S. Pat. No. 7,112,479, and which is hereby incorporated by reference.

TECHNICAL FIELD

The invention pertains to semiconductor constructions, and pertains to methods of forming gatelines and transistor devices.

BACKGROUND OF THE INVENTION

Transistor devices have numerous applications in semiconductor constructions. The devices are typically formed along a line of conductive material, which can be referred to as a gateline or wordline.

There will typically be a large number of transistor devices associated with a semiconductor construction, with some of the devices having different desired purposes than others of the devices. It is generally desired to tailor the operational parameters of a transistor device to match a particular application of the device. Accordingly, it is frequently desired to tailor some transistor devices differently than others since the various devices will have different desired applications relative to one another.

The above-discussed goal to separately tailor some transistor devices relative to others is a continuing goal in the semiconductor industry, and there is a continuing desire to develop new methods of forming transistor structures which can allow some of the structures to be tailored for different applications than others of the structures. There is also a continuing goal in the semiconductor industry to reduce masking or other process steps in order to improve throughput and economy associated with semiconductor fabrication processes, as well as to reduce the various errors that can be introduced by each additional masking or other process step of a semiconductor fabrication process.

SUMMARY OF THE INVENTION

In one aspect, the invention includes a damascene method of forming a gateline. A thin segment of dielectric material is provided between two or more thicker segments of dielectric material, with the thin and thicker segments of dielectric material being within an opening. Gateline material is then formed within the opening and over the thin and thicker segments of dielectric material.

In one aspect, the invention encompasses a method of forming a transistor device. A substrate is provided, and a first layer is formed over the substrate. A second layer is formed over the first layer, with the second layer being patterned to have an opening extending therethrough to the first layer. The second layer defines sidewalls of the opening, and the first layer defines a bottom of the opening. A third layer is formed over the second layer and within the opening to narrow the opening. The third layer lines the sidewalls and the bottom of the opening. A fourth layer is formed over the third layer and within the narrowed opening. The fourth layer is anisotropically etched to form sidewall spacers along the sidewalls of the opening. A portion of the third layer is exposed between the sidewall spacers. The exposed portion of the third layer is removed, and the sidewall spacers are then removed to leave steps of the third layer along the sidewalls. A gateline is formed within the opening and over the steps of the third layer. The second layer is removed, and source/drain regions are formed adjacent the gateline and in a configuration such that the source/drain regions are gatedly interconnected by the gateline.

In one aspect, the invention includes a semiconductor construction. The construction comprises a semiconductor substrate having a primary surface defining a horizontal direction, and a gate dielectric region over the semiconductor substrate. The gate dielectric region includes a thin segment of dielectric material between two thicker segments of dielectric material. The thin and thicker segments of dielectric material comprise upper surfaces substantially parallel to the primary surface of the substrate, and are joined to one another at steps having primary surfaces substantially orthogonal to the primary surface of the substrate. A gateline is over the thin and thicker segments of the gate dielectric region, and the gateline has a pair of opposing sidewalls. A pair of opposing source/drain regions are along the opposing sidewalls of the gateline, and joined to one another through a channel controlled by the gateline.

BRIEF DESCRIPTION OF THE DRAWINGS

Preferred embodiments of the invention are described below with reference to the following accompanying drawings.

FIG. 1 is a diagrammatic, cross-sectional view of a semiconductor wafer fragment at a preliminary processing stage of an exemplary aspect of the present invention.

FIG. 2 is a view of the FIG. 1 wafer fragment shown at a processing stage subsequent to that of FIG. 1.

FIG. 7 is a view of the FIG. 1 wafer fragment shown at a processing stage subsequent to that of FIG. 6.

FIG. 8 is a diagrammatic, cross-sectional view of a semiconductor wafer fragment illustrating an exemplary transistor structure of an aspect of the present invention.

DETAILED DESCRIPTION OF THE PREFERRED EMBODIMENTS

Figure 3:
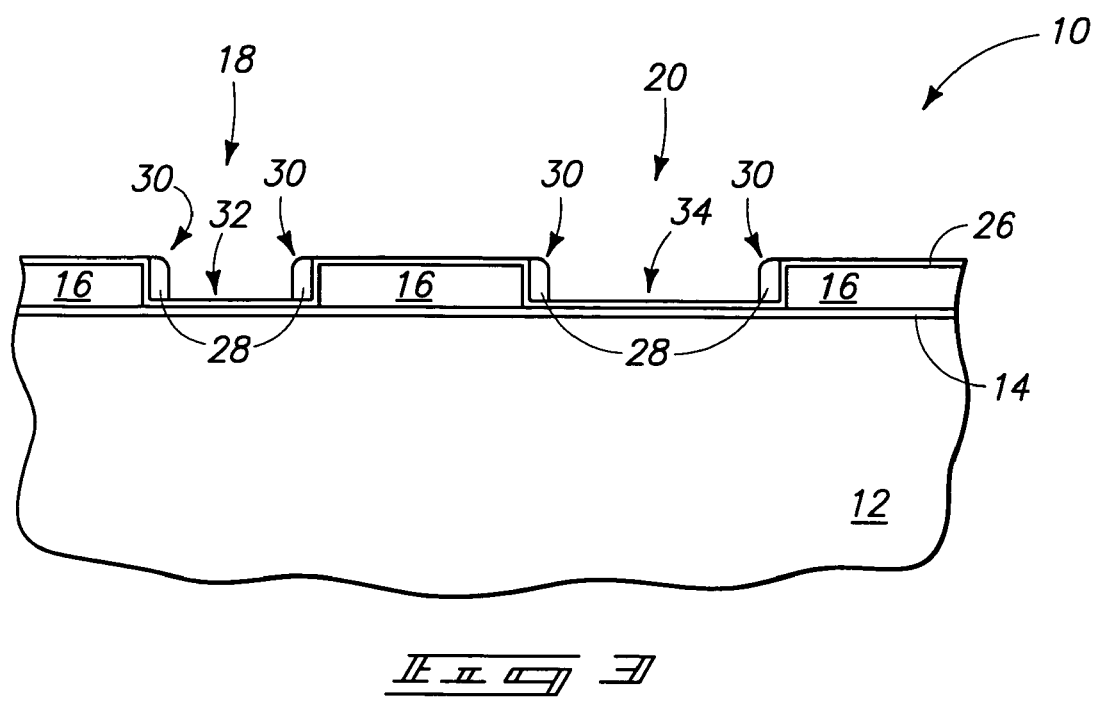
FIG. 3 is a view of the FIG. 1 wafer fragment shown at a processing stage subsequent to that of FIG. 2.

This disclosure of the invention is submitted in furtherance of the constitutional purposes of the U.S. Patent Laws "to promote the progress of science and useful arts" (Article 1, Section 8).

In particular aspects, the invention provides a gateline structure having a conductive gateline over gate dielectric. The gate dielectric is thickened beneath edges of the gateline and thinned beneath a central region of the gateline. The invention also includes methodology for forming such structure. Exemplary aspects of the invention are described with reference to FIGS. 1-8.

Referring initially to FIG. 1, a semiconductor construction 10 is illustrated at a preliminary processing stage. Construction 10 comprises a substrate 12 having a dielectric layer 14 thereover. Substrate 12 can comprise, for example, monocrystalline silicon lightly-doped with background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. The substrate 12 has a primary surface 13 which can be considered to define a horizontal direction.

Dielectric material 14 can, in particular aspects, comprise, consist essentially of, or consist of silicon dioxide, and can be referred to as pad oxide.

A patterned layer 16 is formed over dielectric material 14. Patterned layer 16 can, in particular aspects, comprise, consist essentially of, or consist of silicon nitride.

Patterned layer 16 has openings 18 and 20 extending therethrough to an upper surface of layer 14. The openings have sidewall peripheries (or sidewalls) 19 defined by layer 16, and have bottom peripheries (or bottoms) 21 defined by the upper surface of layer 14. The openings 18 and 20 have respective widths 22 and 24, with such widths corresponding to a distance between the sidewalls of the openings. The shown width 24 of opening 20 is greater than the shown width 22 of opening 18.

Openings 18 and 20 are representative of a large number of openings that would typically be formed over the substrate, and are utilized to illustrate, among other things, that some of the openings can have a different width than others.

Referring next to FIG. 2, a layer 26 is formed over layer 16 and within the openings 18 and 20 to narrow the openings. Subsequently, another layer 28 is formed over layer 26 and also within the openings 18 and 20. Layers 26 and 28 are preferably selectively etchable relative to one another (with the term "selectively etchable" indicating that the layers can be subjected to etching conditions which etch one of the layers at a faster rate than the other, which can include, but is not limited to, conditions which are 100% selectable for one of the layers relative to the other).

In particular aspects, layer 26 can comprise the same composition as layer 14, and in such aspects layer 26 can, for example, comprise, consist essentially of, or consist of silicon dioxide. In other aspects, layer 26 can have a different composition than layer 14. In a particular aspect, layer 26 can comprise, consist essentially of, or consist of a dielectric material having a higher dielectric constant than silicon dioxide (a so-called high-k dielectric material), while layer 14 consists essentially of, or consists of silicon dioxide. For instance, layer 26 can comprise, consist essentially of, or consist of hafnium oxide, while layer 14 consists essentially of or consists of silicon dioxide. Layer 26 is a dielectric material, and ultimately forms a region of a gate dielectric, as will become more clear in the discussion that follows.

Layer 28 can comprise any suitable composition, and is generally sacrificial. Accordingly, layer 28 can be electrically conductive or electrically insulative, although layer 28 will typically be electrically insulative. In particular aspects, layer 28 can have a composition identical to that of layer 16, and in such aspects, for example, layers 28 and 16 can both comprise, consist essentially of, or consist of silicon nitride.

The layers 14, 16, 26 and 28 can, in some aspects, be referred to as a first layer, second layer, third layer and fourth layer, respectively, to assist in distinguishing the layers from one another.

Referring next to FIG. 3, layer 28 is anisotropically etched to form sidewall spacers 30 along the sidewalls of openings 18 and 20. As will be recognized by persons of ordinary skill in the art, the thickness of the spacers along the bottoms of the openings will be related to the starting thickness of layer 28, and accordingly the spacers can be formed to be thicker by starting with a thicker layer 28. Also, since the spacers in openings 18 and 20 were formed from a common layer 28 utilizing common anisotropic etching conditions, the spacers within layer 20 will be the same width as the spacers within opening 18. A portion 32 of layer 26 is exposed within opening 18 between the spacers 30, and another portion 34 of layer 26 is exposed within opening 20 between the spacers 30. The portion 34 is longer than the portion 32.

Figure 4:
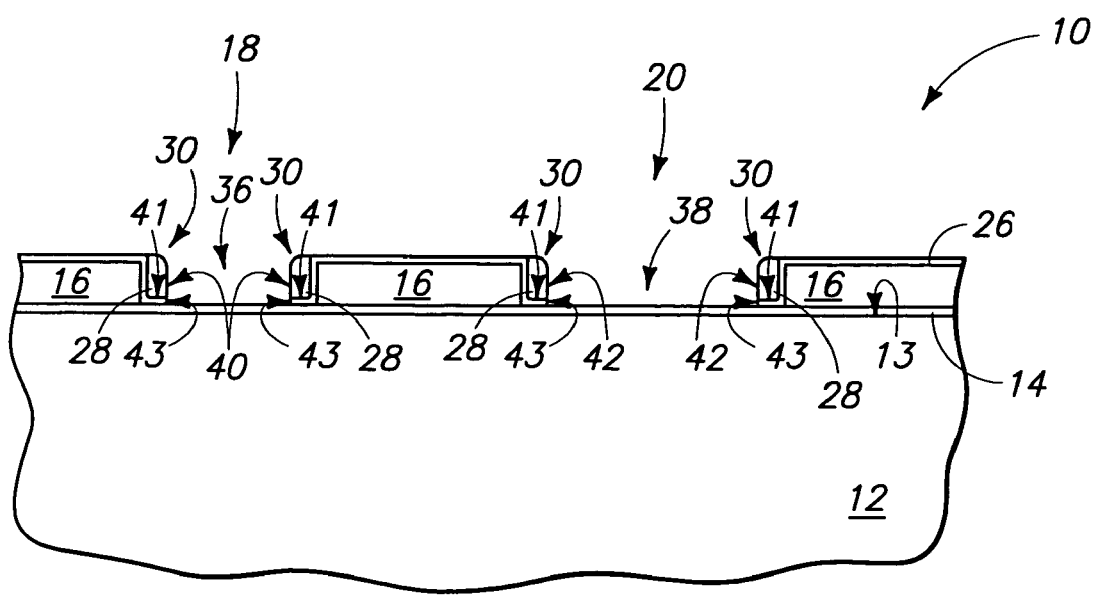
FIG. 4 is a view of the FIG. 1 wafer fragment shown at a processing stage subsequent to that of FIG. 3.

Referring next to FIG. 4, the portions 32 and 34 (FIG. 3) of layer 26 are removed, which exposes portions 36 and 38 of layer 14 within the openings 18 and 20, respectively.

Segments of material 26 remaining within openings 18 and 20 after removal of portions 32 and 34 (FIG. 3) can be considered to define steps 40 along the bottom of opening 18, and steps 42 along the bottom of opening 20. The steps 40 and 42 have substantially horizontal top surfaces 41 and substantially vertical side surfaces 43. The horizontal top surfaces 41 can be considered to be parallel to the primary surface 13 of substrate 12.

Figure 5:
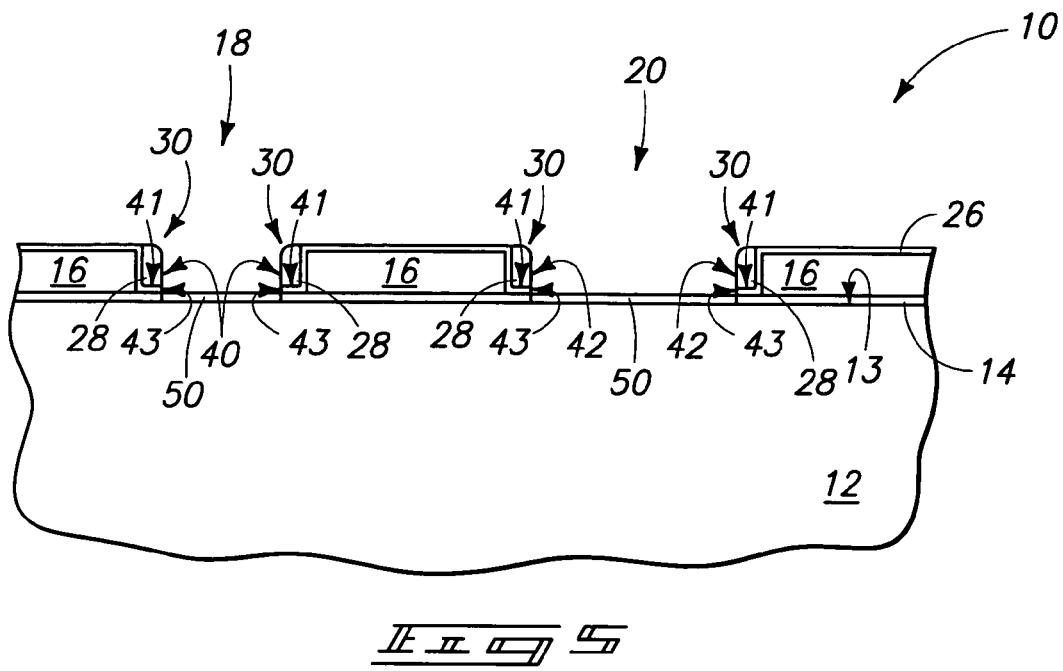
FIG. 5 is a view of the FIG. 1 wafer fragment shown at a processing stage subsequent to that of FIG. 4.

Referring next to FIG. 5, the portions 36 and 38 (FIG. 4) of layer 14 are removed and replaced by dielectric material 50. Such is an optional processing step, but can be advantageous in that it replaces dielectric material segments which may have been damaged during previous processing with fresh dielectric material which may be more suitable for ultimate utilization as gate dielectric. The material 50 can, for example, comprise, consist essentially of, or consist of silicon dioxide. Removal of segments 36 and 38 of material 14 can comprise, for example, a hydrofluoric acid strip, or other suitable etchant strip of silicon-dioxide-containing segments 36 and 38. Material 50 can then be formed by thermal oxidation of a surface of substrate 12 to form a fresh layer of silicon dioxide over the surface and/or by deposition (for example, either chemical vapor deposition or atomic layer deposition) of silicon dioxide within openings 18 and 20 to form the segments 50. The segments 50 can, in some aspects of the invention, be described as a fifth layer to distinguish such segments from the first, second, third and fourth layers 14, 16, 26 and 28 described previously.

The dielectric material of segment 50 is thinner than the combined dielectric materials 14 and 26, as shown. Thus, the dielectric material along the bottom of each opening is a thin segment of material 50 between two thick segments comprising the combined materials 14 and 26. Since opening 20 is wider than opening 18, and since the sidewall spacers 30 were the same width in openings 18 and 20, the segment 50 is longer in opening 20 than in opening 18. Thus, the percentage of the width of opening 18 consumed by segment 50 is less than the percentage of the width of opening 20 consumed by segment 50.

Figure 6:
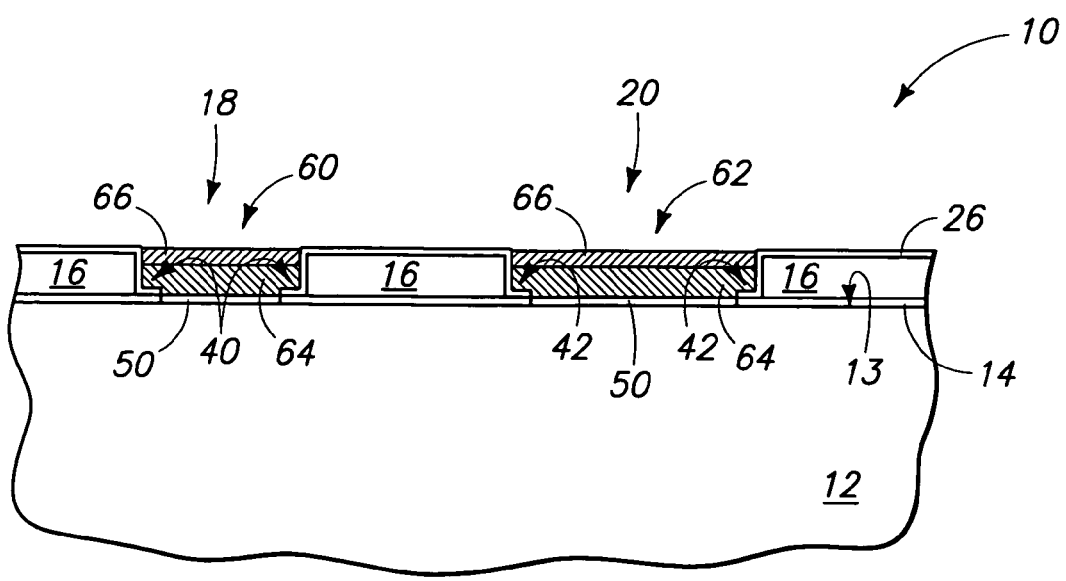
FIG. 6 is a view of the FIG. 1 wafer fragment shown at a processing stage subsequent to that of FIG. 5.

Referring next to FIG. 6, sidewall spacers 30 (FIG. 5) are removed, and conductive gateline material is formed within the openings 18 and 20 to form gatelines 60 and 62. As will be understood by persons of ordinary skill in the art, the openings 18 and 20 will typically be trenches extending into and out of the page relative to the cross-section of FIG. 6, and accordingly the gatelines 60 and 62 would also extend into and out of the page of the shown cross-section.

The gateline material utilized to form gatelines 60 and 62 is shown to comprise two layers 64 and 66. Layer 64 can comprise, consist essentially of, or consist of conductively-doped silicon such as, for example, conductively-doped amorphous and/or polycrystalline silicon. Layer 66 can comprise, consist essentially of, or consist of metal silicide, such as, for example, cobalt silicide. It is to be understood that the shown gateline material is an exemplary material, and that any suitable gateline material can be utilized, including, for example, gateline material comprising less than two or more than two electrically conductive layers.

The gateline material can be formed into the shown configuration by initially forming the gateline material within openings 18 and 20 and over a surface of layer 26, and then subsequently planarizing the material to remove the material from over surface 26 and leave the shown electrically separated lines 60 and 62. The planarization can be accomplished utilizing any suitable methodology including, for example, chemical-mechanical polishing.

The gatelines 60 and 62 are over the steps 40 and 42 of dielectric material 26, as well as over the thinner dielectric material 50. Accordingly, the construction of FIG. 6 can be understood to have thin segments of dielectric material 50 within the openings 18 and 20, with the thin segments of dielectric material being between two thicker segments of dielectric material (the thicker segments comprising step 40 and material 14 within opening 18, and step 42 and material 14 within opening 20). The construction can further be understood to comprise gateline material formed within the openings 18 and 20, and over the thin and thicker segments of dielectric material.

The thin segment of dielectric material within the openings can comprise a different chemical composition than the thicker segments. For instance, the thin segment can comprise, consist essentially of, or consist of silicon dioxide; and the thicker segments can comprise a lower portion (layer 14) comprising, consisting essentially of, or consisting of silicon dioxide, and an upper portion (portion 26) comprising, consisting essentially of, or consisting of high-k dielectric material, such as, for example, hafnium oxide.

Referring next to FIG. 7, second layer 16 is removed together with the portion of layer 26 that had been over the second layer. This removal can be accomplished with any suitable processing, including, for example, photolithographic processing to form a protective mask over lines 60 and 62 and the material 26 along sidewalls of the lines, while leaving other sections of material 26 exposed; followed by removal of exposed portions 26 and the material 16 under such exposed portions; and subsequent removal of the protective mask to leave the structure shown in FIG. 7.

The FIG. 7 structure comprises gatelines 60 and 62 having dielectric material 26 along sidewalls of the gatelines, and having dielectric materials 26 and 50 beneath the gatelines. In subsequent processing (described below with reference to FIG. 8) source/drain regions can be formed adjacent the gatelines to form transistor structures. Additionally, isolation regions (not shown) can be formed to electrically isolate source/drain regions associated with one gateline from source/drain regions associated with another gateline. The isolation regions can comprise, for example, shallow trench isolation regions formed within substrate 12. Such isolation regions can be formed prior to the processing stage shown above with reference to FIG. 1, and specifically prior to formation of layers 14 and 16 over substrate 12, or can be formed after the processing stage of FIG. 7. Similarly, the source/drain regions can be formed prior to the processing stage of FIG. 1, or after the processing stage of FIG. 7. Typically, heavily-doped source/drain regions will be formed after the processing stage of FIG. 7 so that the source/drain regions can be self-aligned relative to gatelines 60 and 62. However, channel regions associated with semiconductor devices will typically, as is known to persons of ordinary skill, be beneath the gatelines 60 and 62. It can be advantageous to provide the channel region implants prior to formation of gatelines 60 and 62. Such channel region implants can be conducted prior to the processing stage of FIG. 1, or can be conducted after openings 18 and 20 have been formed through layer 16 at the processing stage of FIG. 1 so that the channel region implants are aligned relative to the location where the gatelines will ultimately be formed.

The methodology of FIGS. 1-7 can be considered damascene methodology, in that the gatelines are formed within openings patterned into a masking material (with such masking material being material 16), rather than being patterned from an expanse of gateline material utilizing a mask provided over such expanse. It is to be understood, however, that the methodology and structures described herein can be extended beyond damascene processing. Accordingly the invention encompasses aspects besides the specific damascene aspects described herein.

FIG. 8 illustrates an exemplary transistor structure which can be formed from one of the gatelines discussed above with reference to FIG. 7. In describing FIG. 8, similar numbering will be used as was utilized above in describing FIGS. 1-7, where appropriate.

The construction of FIG. 8 comprises a transistor structure 80. Such transistor structure includes source/drain regions 70 and 72 on opposing sides of gateline 60 and within substrate 12. Source/drain regions 70 and 72 can comprise conductively-doped diffusion regions extending within substrate 12, and can be heavily-doped with either n-type or p-type dopant. A channel region 74 extends between source/drain regions 70 and 72, and is beneath gateline 60. Gateline 60 operates to control current flow within channel region 74, and accordingly the source/drain regions 70 and 72 are gatedly interconnected to one another through gateline 60.

The gate dielectric is shown to comprise a thin region 100 between a pair of thick regions 102. Region 100 can comprise the segment 50 discussed above, and regions 102 can comprise the combined materials 26 and 14 discussed above. The thick regions join the thin region at steps comprising surfaces 103 that are substantially orthogonal to the primary surface 13 of substrate 12.

An advantage of the gate dielectric construction beneath gateline 60 is that the utilization of thick and thin regions of the gate dielectric can allow the transistor device to be specifically tailored for particular applications. Additionally, the utilization of different compositions in the thick regions relative to the thin regions can further allow tailoring of properties of the transistor device. For instance, utilization of high-k dielectric material thick region 102 allows the high-k material to be utilized beneath corners of the gateline 60, which enables the high dielectric constant associated with a high-k dielectric to be taken advantage of at such corners. Further, the utilization of thin silicon dioxide within the central region 100 beneath the transistor gate can enable the enhanced mobility achievable with silicon dioxide to be taken advantage of.

The relative percentage of the width beneath gateline 60 consumed by thick regions 102 relative to thin region 100 can be adjusted for particular applications. It can be desired that a percentage of the width beneath the gateline consumed by thick segments 102 be from about 10% to about 75% of the total width beneath the gateline, and in particular aspects be from about 20% to about 50% of the width beneath the gateline, and typically be about 30% of the width beneath the gateline. Accordingly, it can be desired to have the width beneath the gateline consumed by thin region 100 be from about 25% to about 90%, and in particular aspects be from about 60% to about 80%, and be about 70% in an exemplary aspect.

The distance beneath the gateline 60 in the cross-section of FIG. 8 is referred to as width to distinguish such distance from a length of the gateline that would extend into and out of the page. Such terminology is different than, but not inconsistent with, the prior art terminology of referring to the distance between source/drain regions 70 and 72 as a channel length of an individual transistor device. Specifically, the width of a gateline can correspond to a channel length of a transistor device incorporating a segment of the gateline as a gate.

The transistor structure 80 of FIG. 8 can be utilized in any suitable application, and can, for example, be utilized in various logic structures or memory structures. In particular aspects, the transistor can be utilized in a dynamic random access memory (DRAM) structure. In such aspects, one of the source/drain regions 70 and 72 is connected to a bitline, and the other of the source/drain regions is connected to a charge storage device (such as, for example, a capacitor). In the shown aspect, source/drain region 70 is connected to a bitline 82, and source/drain region 72 is connected to a charge storage device 84.

The relative percentage of the width beneath the gateline consumed by thick portions 102 relative to thin portion 100 can be determined by the initial size of the opening utilized to pattern the gateline (openings 18 and 21 in FIG. 1), and the thicknesses of materials 26 and 28 utilized at the processing stage of FIG. 2. In particular aspects of the invention, different transistors having different operational characteristics relative to one another can be simultaneously formed with a damascene process utilizing differing widths of openings. For instance, in the aspect of the invention described with reference to FIGS. 1-7, the opening 24 utilized to pattern gateline 62 is wider than the opening 22 utilized to pattern gateline 60. Accordingly, the relative percentage of the width beneath gateline 60 that is consumed by thick portions of the dielectric material will be greater than the relative percentage of the width underneath gateline 62 consumed by thick portions of dielectric material. This can allow the threshold voltage of transistor structures formed from gatelines 60 and 62 to be tailored to be different from one another, which can allow such transistor structures to be tailored for different applications relative to one another.

Methodology of the present invention can advantageously allow thick oxide to be grown beneath gate edges to allow a length of the channel beneath the gate to be controlled, and yet avoids selective oxidation procedures utilized in the prior art to form so-called smiling gate oxide structures. Devices formed in accordance with the present invention can have suitable reliability for semiconductor applications, and can have additional control of threshold voltage beyond that provided by prior art processes. Further, the present invention can allow more stringent control of the amount of thick dielectric beneath a gateline than is attainable by prior art processes which utilize oxidation of materials under a gateline to thicken dielectric at the edges of the gateline relative to dielectric beneath a center of the gateline.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a gateline, comprising:
   forming a thin segment of dielectric material between two or more thicker segments of dielectric material, with the thin and thicker segments of dielectric material being within an opening;
   forming gateline material within the opening and over the thin and thicker segments of dielectric material;
   wherein the thin segment of dielectric material consists of silicon dioxide; and
   wherein the thicker segments of dielectric material consist of only two layers; said only two layers being a layer consisting of hafnium oxide over a layer consisting of silicon dioxide.

2. A method of forming a pair of gatelines, comprising:
   providing a first opening and a second opening over a substrate; the first and second openings having widths, and the width of the second opening being greater than that of the first opening;
   forming a first thin dielectric segment and a pair of first thicker dielectric segments within the first opening, the first thin dielectric segment being between the pair of first thicker dielectric segments;
   forming a second thin dielectric segment and a pair of second thicker dielectric segments within the second opening, the second thin dielectric segment being between the pair of second thicker dielectric segments, the second thicker dielectric segments being about the same length as the first thicker dielectric segments and accordingly the second thin dielectric segment being longer than the first thin dielectric segment;
   forming first gateline material within the first opening and over the first thin dielectric segment and first thicker dielectric segments; and simultaneously with the forming of the first gateline material, forming second gateline material within the second opening and over the second thin dielectric segment and second thicker dielectric segments; and
   wherein all of the first and second thicker dielectric segments consist of only two layers; said only two layers being a layer consisting of hafnium oxide over a layer consisting of silicon dioxide.

3. The method of claim 2 wherein the first and second thin dielectric segments have a same composition as one another.

4. The method of claim 3 wherein the first and second thin dielectric segments comprise silicon dioxide.

5. The method of claim 3 wherein the first and second thin dielectric segments consist essentially of silicon dioxide.

6. The method of claim 3 wherein the first and second thin dielectric segments consist of silicon dioxide.

7. A method of forming a gateline, comprising:
   forming a construction comprising a patterned first layer over a substrate, the patterned first layer having an opening therethrough; the construction also including a first dielectric segment having a first thickness and a second dielectric segment having a second thickness, with the second thickness being greater than the first thickness and the second dielectric material being on opposing sides of the first dielectric material within the opening;
   forming gateline material within the opening and over the first and second dielectric material segments;
   wherein the first dielectric material segment consists of silicon dioxide; and
   wherein the second dielectric material segment consists of only two layers, said only two layers being a layer consisting essentially of high k dielectric material over a layer consisting essentially of silicon dioxide.

8. The method of claim 7 wherein the high k dielectric material is hafnium oxide.

9. A method of forming a gateline, comprising:

forming a construction comprising a patterned silicon nitride layer over a substrate, the patterned silicon nitride layer having an opening therethrough and having high k dielectric material thereover; the construction also including first and second dielectric material segments within the opening; the first dielectric material segment having a first thickness and the second dielectric material segment having a second thickness, the second thickness being greater than the first thickness and the second dielectric material segment being on opposing sides of the first dielectric material segment within the opening;

forming electrically conductive gateline material within the opening and over the first and second dielectric material segments;

wherein the first dielectric material segment consists essentially of silicon dioxide;

wherein the second dielectric material segment consists only of two layers; an upper of said two layers consisting of the high k dielectric material, and a lower of said two layers consisting essentially of silicon dioxide; and wherein the electrically conductive gateline material within the opening has an upper surface that is coplanar with an upper surface of the high dielectric material over the silicon nitride layer.

\* \* \* \* \*